United States Patent
Sampath et al.

(10) Patent No.: US 8,873,671 B2
(45) Date of Patent: Oct. 28, 2014

(54) METHOD AND SYSTEM FOR LLR BUFFER REDUCTION IN A WIRELESS COMMUNICATION MODEM

(75) Inventors: Hemanth Sampath, San Diego, CA (US); Avneesh Agrawal, San Diego, CA (US); Jeremy H. Lin, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 1005 days.

(21) Appl. No.: 12/405,649

(22) Filed: Mar. 17, 2009

(65) Prior Publication Data

US 2010/0067598 A1 Mar. 18, 2010

Related U.S. Application Data

(60) Provisional application No. 61/039,775, filed on Mar. 26, 2008.

(51) Int. Cl.
| | |
|---|---|
| *H04L 27/00* | (2006.01) |
| *H04L 1/00* | (2006.01) |
| *H03M 13/00* | (2006.01) |
| *H04L 25/06* | (2006.01) |
| *H03M 13/45* | (2006.01) |
| *H04L 5/00* | (2006.01) |
| *H04L 1/18* | (2006.01) |

(52) U.S. Cl.
CPC ............ *H03M 13/45* (2013.01); *H04L 1/0046* (2013.01); *H03M 13/6588* (2013.01); *H04L 5/0007* (2013.01); *H04L 1/1819* (2013.01); *H04L 25/067* (2013.01)
USPC ............ 375/295; 375/221; 375/238; 375/316

(58) Field of Classification Search
USPC .......................... 375/219, 221, 238, 295, 316
See application file for complete search history.

(56) References Cited

U.S. PATENT DOCUMENTS

| | | | |
|---|---|---|---|
| 6,049,537 A | * | 4/2000 | Proctor et al. ............... 370/342 |
| 6,166,667 A | | 12/2000 | Park |

(Continued)

FOREIGN PATENT DOCUMENTS

| | | |
|---|---|---|
| CN | 1926831 A | 3/2007 |
| GB | 2291570 A | 1/1996 |

(Continued)

OTHER PUBLICATIONS

International Search Report and Written Opinion—PCT/US2009/038146—ISA/EPO—Sep. 22, 2009.

(Continued)

*Primary Examiner* — Chieh M. Fan
(74) *Attorney, Agent, or Firm* — Abdollah Katbab

(57) ABSTRACT

A system involves a transmitting device (for example, a first wireless communication device) and a receiving device (for example, a second wireless communication device). In the receiving device, LLR (Log-Likelihood Ratio) values are stored into an LLR buffer. LLR bit width is adjusted as a function of packet size of an incoming transmission to reduce the LLR buffer size required and/or to prevent LLR buffer capacity from being exceeded. The receiver may use a higher performance demodulator in order to maintain performance despite smaller LLR bit width. In the transmitting device, encoder code rate is adjusted as a function of receiver LLR buffer capacity and packet size of the outgoing transmission such that receiver LLR buffer capacity is not exceeded. Any combination of receiver LLR bit width adjustment, demodulator selection, and encoder code rate adjustment can be practiced to reduce LLR buffer size required while maintaining performance.

13 Claims, 8 Drawing Sheets

(56) References Cited

U.S. PATENT DOCUMENTS

| | | |
|---|---|---|
| 7,424,058 B1 * | 9/2008 | Staley et al. ............ 375/240.23 |
| 7,437,654 B2 * | 10/2008 | Das et al. ...................... 714/790 |
| 7,720,017 B2 | 5/2010 | Khan et al. |
| 2004/0153942 A1 | 8/2004 | Shtutman |
| 2006/0045214 A1 | 3/2006 | Shiina |
| 2006/0133533 A1 * | 6/2006 | Khandekar et al. ........... 375/279 |
| 2006/0179387 A1 * | 8/2006 | Taffin et al. .................. 714/746 |
| 2007/0195738 A1 | 8/2007 | Kim |
| 2007/0283209 A1 * | 12/2007 | Paumier et al. ............... 714/752 |
| 2007/0288832 A1 | 12/2007 | Adachi |
| 2008/0056396 A1 | 3/2008 | Li |
| 2008/0168332 A1 * | 7/2008 | Palanki et al. ................ 714/776 |
| 2008/0186212 A1 | 8/2008 | Clerckx |
| 2008/0232400 A1 | 9/2008 | Tsai |
| 2009/0164868 A1 * | 6/2009 | Anand et al. .................. 714/758 |

FOREIGN PATENT DOCUMENTS

| | | |
|---|---|---|
| JP | H01166623 A | 6/1989 |
| JP | 2002185430 A | 6/2002 |
| JP | 2003258762 A | 9/2003 |
| JP | 2006140882 A | 6/2006 |
| JP | 2006279234 A | 10/2006 |
| JP | 2007318330 A | 12/2007 |
| KR | 2007002065 A | 1/2007 |
| WO | 03036890 A1 | 5/2003 |
| WO | 2005088917 A1 | 9/2005 |
| WO | 2005098822 A2 | 10/2005 |
| WO | 2005099161 A1 | 10/2005 |
| WO | 2006099528 A1 | 9/2006 |
| WO | 2007055533 A1 | 5/2007 |
| WO | 2008086236 | 7/2008 |

OTHER PUBLICATIONS

Taiwan Search Report—TW098109966—TIPO—Oct. 22, 2012.
3rd Generation Partnership Project; Technical Specification Group Radio Access Network; Multiplexing and channel coding (FDD); 3GPP TS 25.212 V5.10.0 (Jun. 2005) Release 5.

* cited by examiner

ENCODER IN TRANSMITTER

DECODER IN RECEIVER

| LLR BUFFER MEMORY SIZE | ⟹ | $\frac{1}{\text{CODE RATE}}$ | * | LLR BIT WIDTH | * | PACKET SIZE | * | INTERLACES |
|---|---|---|---|---|---|---|---|---|
| 7.2 MBITS | ⟹ | 5 | * | 6 BITS | * | 40K | * | 6 |

FACTORS AFFECTING LLR BUFFER SIZE REQUIREMENT

FIRST ASPECT

FIRST ASPECT

| INPUTS | | OUTPUTS | |
|---|---|---|---|
| CODE RATE | PACKET SIZE | DEMOD TYPE | LLR BIT WIDTH |
| 1/5 | 8K | MMSE | 6 |
| 1/3 | 12K | MMSE | 6 |
| 1/2 | 40K | ML | 4 |

FIRST ASPECT

FIG. 9

LLR BIT-WIDTH = LLR BUFFER SIZE * CODERATE / (PACKET SIZE*INTERLACES)

IF LLR BIT-WIDTH < MAX LLR BIT-WIDTH(6) AND MODULATION RATE < MAX
MODULATION RATE(64 QAM), {
CHOOSE DEMOD = ML
ELSE CHOOSE DEMOD = MMSE
}

FIRST ASPECT

FIG. 10

SECOND ASPECT

TRANSMITTER OPERATION

SECOND ASPECT

| INPUTS | | OUTPUT |
|---|---|---|
| PACKET SIZE | INTERLACES | CODE RATE |
| 8K | 6 | 1/5 |
| 12K | 6 | 1/3 |
| 40K | 6 | 1/2 |

SECOND ASPECT

FIG. 13

CODE_RATE_VAL = PACKET SIZE * INTERLACES * BITWIDTH / BUFFER SIZE

EXAMPLE CODE_RATE_CHOICES = (1/5, 1/3, ½).

IF CODE_RATE_VAL < 1/5, CODE_RATE = 1/5
IF 1/5 < CODE_RATE_VAL < 1/3, CODE RATE = 1/3
IF 1/3 < CODE_RATE_VAL < ½, CODE RATE = ½
IF CODE RATE VAL > ½, THEN THE TRANSMISSION CANNOT BE SUPPORTED WITH THE GIVEN PACKET SIZE. THE TRANSMITTER NEEDS TO LOWER PACKET SIZE OR INACTIVATE SOME INTERLACES.

SECOND ASPECT

FIG. 14

METHOD AND SYSTEM FOR LLR BUFFER REDUCTION IN A WIRELESS COMMUNICATION MODEM

CROSS-REFERENCE TO RELATED APPLICATION

This application claims the benefit under 35 U.S.C. §119 of Provisional Application Ser. No. 61/039,775. filed Mar. 26, 2008. said provisional application is incorporated herein by reference.

BACKGROUND INFORMATION

1. Technical Field

The present disclosure relates to managing parameters that affect the amount of buffer memory space used to store Log-Likelihood Ratio (LLR) values in a receiver.

2. Background Information

In communication systems, such as cellular telephone systems, information is often to be communicated between devices in the presence of noise and other environmental factors that interfere with the communication. To prevent loss of information, the original information to be communicated is often encoded along with additional information before transmission. After reception, the received information is decoded to recover the original information. Due to the encoding and decoding process, if some of the transmitted information is lost during transmission between transmitter and receiver, the received information can nevertheless often be used to recover the original information.

FIG. 1 (Prior Art) is a simplified block diagram illustrating such an encoding process. A plurality of bits 100 of data undergoes encoding 101 to generate a larger number of encoded bits 102. The encoding process adds redundancy to the original data by producing several encoded bits 102 for each incoming bit 100. The encoded bits 102 are sometimes referred to as "symbols." The measure of redundancy introduced by the encoder 101 is often referred to as "code rate." In the illustration, a data packet 103 containing "X" number of data bits is encoded by an encoder 104 with a code rate of 1/5. The code rate of 1/5 means that encoder 104 produces five encoded bits 105 for each data bit in data packet 103. Encoder 104 can be a turbo encoder or a Viterbi encoder. The added redundancy provides protection against noise and disturbances in the transmission of data.

In the art, encoder 104 with a code rate of 1/5 is considered to have a relatively low code rate, and thus provides a relatively high amount of redundancy. An encoder with a code rate of 1/2 would produce only two encoded bits for each data bit in a data packet. An encoder with a code rate of 1/2 would be considered to have a relatively high code rate, and provide a relatively low amount of redundancy. After the encoding process, encoded bits 105 are typically blocked together by a modulator (not shown) and mapped to points on a constellation by a mapper (not shown) before being transmitted to a receiver.

FIG. 2 (Prior Art) is a simplified block diagram illustrating a part of the receiver that receives the transmission of encoded data. The received signal is digitized to produce samples 106. Samples 106 are converted by a Fast Fourier Transform (FFT) circuit 107 into symbols 108. A demodulator circuit 109 outputs an I/Q modulation symbol and a signal-to-noise ratio (SNR) measurement 110 for each symbol. The I/Q and SNR information is then converted by a Log-Likelihood Ratio (LLR) generator 111 into a set of soft-information values referred to as LLR values. Each LLR value 112 produced by LLR generator 111 is stored into an LLR buffer memory 113. The LLR buffer memory 113 is typically a Random-Access Memory (RAM). The number of bits used to represent each LLR value 112 is referred to as the "LLR bit width." If the LLR bit width is larger, then more LLR buffer memory is generally required to store the LLR values, whereas if the LLR bit width is smaller then less LLR buffer memory is generally required to store the LLR values. Then, in a reversal of the encoding process described above in connection with FIG. 1, the LLR values from LLR buffer 113 are decoded by a decoder 114 to generate data bits 115. Ideally, data bits 115 of FIG. 2 are identical to the original data bits 103 of FIG. 1, despite the presence of interference and the loss of some of the transmission from the transmitter to the receiver.

Ways are sought to reduce the cost of implementing the overall transmitter and receiver system without unduly degrading system performance.

SUMMARY

A system involves a transmitting device (for example, a wireless communication device) and a receiving device (for example, a wireless communication device). In the receiving device, a Log-Likelihood Ratio (LLR) generator generates LLR values and these LLR values are stored into an LLR buffer memory. The number of bits used to represent each LLR value is referred to as the "LLR bit width."

In a first aspect, LLR bit width is adjusted in the receiving device as a function of the packet size of an incoming transmission in order to reduce the amount of LLR buffer memory required and/or to prevent LLR buffer memory capacity from being exceeded. The processor of the receiver may receive a communication from the transmitter that informs the receiver of the packet size being used. In one example of the first aspect, the receiver uses a higher performance demodulator in order to maintain a desired performance despite the use of smaller LLR bit widths. For example, using a higher performance demodulator may be possible in cases where packets use a lower modulation order such as QPSK. In such cases, a higher-performance demodulator such as a Maximum Likelihood (ML) demodulator may be easy to implement, and may have power consumption characteristics similar to that of a lower performance demodulator such as an MMSE demodulator. If the higher performance demodulator (such as an ML demodulator) is impractical due to high implementation complexity or high power consumption, then a lower performance demodulator that consumes less power is used in order to reduce power consumption of the receiver. Typically, higher performance demodulators such as Maximum Likelihood demodulators for 16 QAM, 64 QAM and 256 QAM have high implementation complexity and high power consumption. In addition to adjusting LLR bit width in the receiver as a function of packet size, LLR bit width in the receiver can be adjusted as a function of one or more of the following: encoder code rate, number of interlaces and the LLR buffer size.

In a second aspect, encoder code rate in the transmitter is adjusted as a function of receiver LLR buffer capacity and of packet size of the outgoing transmission such that receiver LLR buffer capacity is not exceeded. The transmitter may receive a communication from the receiver that informs the transmitter of the LLR buffer storage capacity in the receiver. Or, the receiver may instead transmit a mapping table to the transmitter. The transmitter, in such a case, uses the mapping table to determine transmit parameters such that the receiver LLR buffer capacity is not exceeded. Any combination of receiver LLR bit width adjustment, demodulator selection, and encoder code rate adjustment can be practiced to prevent receiver LLR buffer storage capacity from being exceeded while at the same time maintaining system performance. The first and second aspects can be employed to reduce the amount of LLR buffer memory provided in a wireless communication device such that manufacturing cost of the wireless communication device is reduced.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 9 is diagram showing input parameters used by a receiver to determine the LLR bit width and demodulator type in accordance with the first aspect.

FIG. 10 sets forth an algorithm usable to determine demodulator type and LLR bit width as a function of input parameters in accordance with the first aspect.

FIG. 13 is a diagram showing input parameters used by a transmitter to determine encoder code rate in accordance with the second aspect.

FIG. 14 sets forth an algorithm usable to determine code rate as a function of input parameters in accordance with the second aspect.

DETAILED DESCRIPTION

Figure 3:
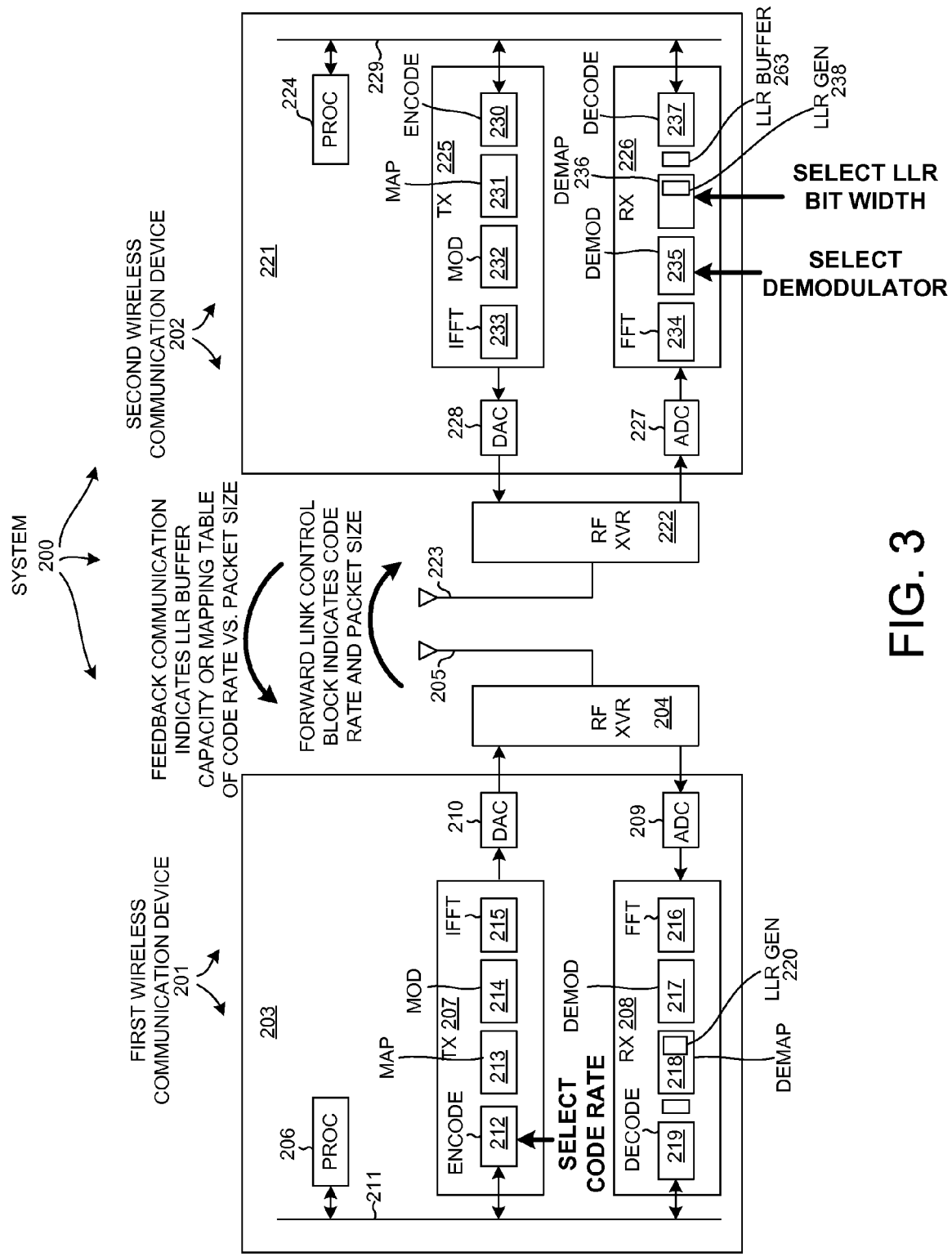
FIG. 3 is a very simplified high level block diagram of a system involving a first wireless communication device and a second wireless communication device.

FIG. 3 is a simplified high level block diagram of a system 200 involving a first wireless communication device 201 and a second wireless communication device 202. Wireless communication devices 201 and 202 may, for example, be a base station and a cellular telephone. First wireless communication device 201 includes a digital baseband integrated circuit 203, a radio-frequency transceiver integrated circuit (RF XVR) 204 and an antenna 205. Digital baseband integrated circuit 203 includes a processing circuit 206, a transmit channel (TX) 207, a receive channel (RX) 208, an Analog-to-Digital Converter (ADC) 209, a Digital-to-Analog Converter (DAC) 210, and a bus 211. Transmit channel 207 includes an encoder circuit (ENCODE) 212, a map circuit (MAP) 213, a modulator circuit (MOD) 214, and an Inverse Fast Fourier Transform circuit (IFFT) 215. Receive channel 208 includes a Fast Fourier Transform circuit (FFT) 216, a demodulator circuit (DEMOD) 217, a demap circuit (DEMAP) 218, and a decoder circuit (DECODE) 219. DEMAP 218 includes several sub-circuits including an LLR generator 220.

Wireless communication devices 201 and 202, in this example, are of identical construction. Second wireless communication device 202 similarly includes a digital baseband integrated circuit 221, a radio-frequency transceiver integrated circuit (RF XVR) 222 and an antenna 223. Digital baseband integrated circuit 221 includes a processing circuit 224, a transmit channel (TX) 225, a receive channel (RX) 226, an Analog-to-Digital Converter (ADC) 227, a Digital-to-Analog Converter (DAC) 228, and a bus 229. Transmit channel 225 includes an encoder circuit (ENCODE) 230, a map circuit (MAP) 231, a modulator circuit (MOD) 232, and an Inverse Fast Fourier Transform circuit (IFFT) 233. Receive channel 226 includes a Fast Fourier Transform circuit (FFT) 234, a demodulator circuit (DEMOD) 235, a demap circuit (DEMAP) 236, and a decoder circuit (DECODE) 237. DEMAP circuit 236 includes several sub-circuits including an LLR generator 238.

In a very simplified operational example, data is to be communicated from first wireless communication device 201 to second wireless communication device 202. Data supplied by processing circuit 206 passes across bus 211 to TX channel 207. The data passes through a transmit channel data path through ENCODE 212, MAP 213, MOD 214 and IFFT 215. The resulting digital information is converted into analog form by DAC 210. The analog signal is upconverted in frequency in RF XVR 204 and is amplified and is transmitted from antenna 205. Antenna 223 of second wireless communication device 202 receives the transmitted RF signal. The signal is downconverted in frequency by RF XVR 222, and is converted into digital form by ADC 227. The digital information passes through a RX channel data path 226 through FFT 234, DEMOD 235, DEMAP 236, and DECODE 237. The resulting digital information passes via bus 229 to processing circuit 224. As will be described in further detail below, processing circuit 206 in the transmitting first wireless communication device 201 can adjust the encoder code rate. This is indicated in FIG. 3 by the label "SELECT CODE RATE". In the receiving second wireless communication device 202, processing circuit 224 can adjust the LLR bit width of the LLR values output by LLR generator 238. This is indicated in FIG. 3 by the label "SELECT LLR BIT WIDTH". In receiving device 202, processing circuit 224 can also select one of multiple demodulators within DEMOD block 235. This is indicated in FIG. 3 by the label "SELECT DEMODULATOR". How code rate, LLR bit width, and/or demodulator selection can be advantageously controlled to reduce or minimize the amount of LLR buffer memory required without unduly compromising system performance is described in further detail below.

Figure 4:
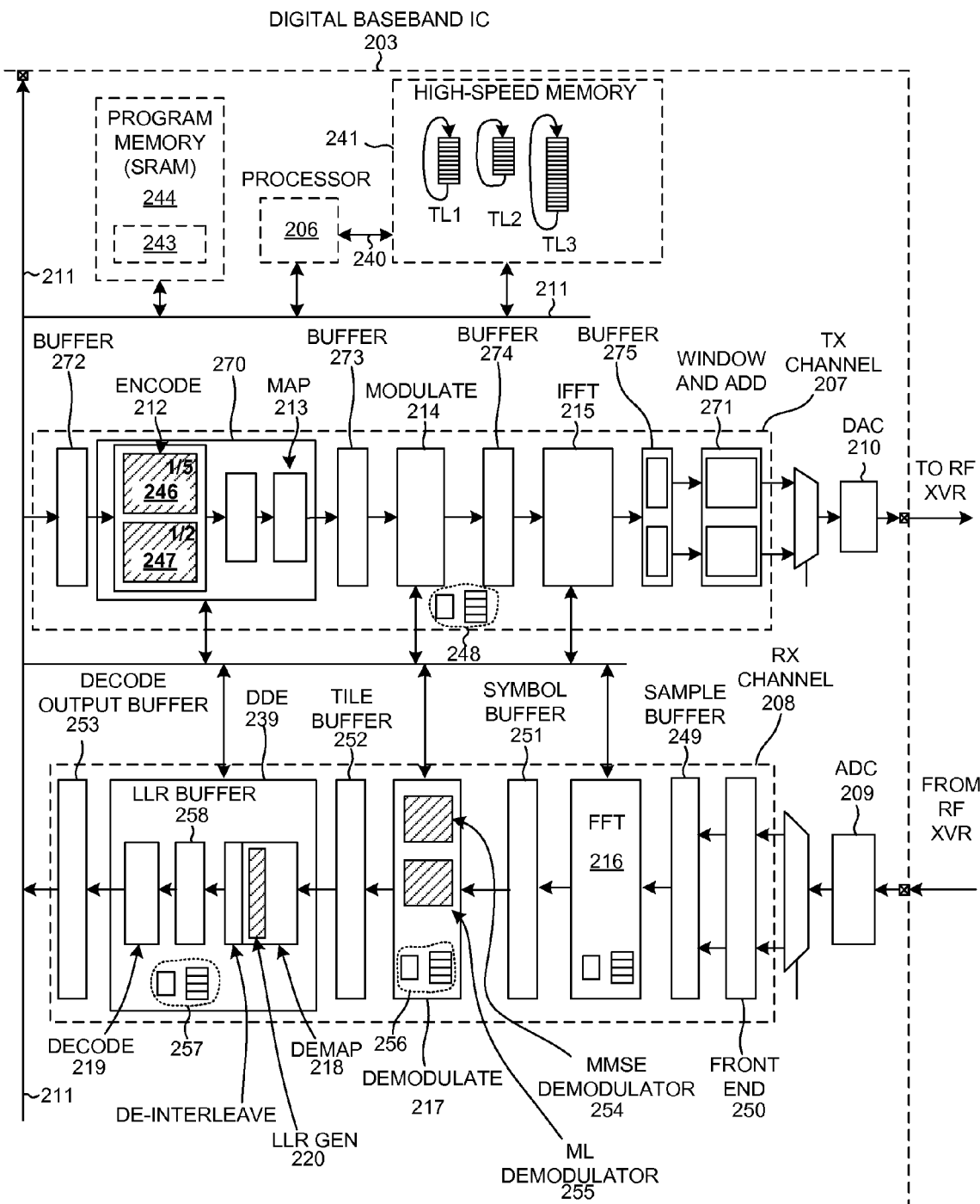
FIG. 4 is a more detailed block diagram of the digital baseband integrated circuit 203 of FIG. 3.

FIG. 4 is a more detailed block diagram of digital baseband integrated circuit 203 of FIG. 3. Processing circuit 206, a first bus 240 and a high-speed memory 241 together form a Tightly Coupled Memory (TCM) system. Processing circuit 206 can read from and write to high-speed memory 241 across first bus 240. Processing circuit 206 executes a program 243 of processor-executable instructions stored in program memory 244. Each of memories 244 and 241 as well as internal registers and memory within processing circuit 206 is a processor-readable medium.

In this example, processing circuit 206 controls the various circuits 216-219 of receive channel 208 and circuits 212-215 of transmit channel 207 using what are called "task lists". A task list includes one or more task instructions. In the illustration, three task lists TL1, TL2 and TL3 are shown stored in memory 241. Each task list contains a sequence of task instructions for execution by an associated circuit of the digital baseband integrated circuit 203. Each of the associated circuits includes a task manager circuit that is coupled to bus 211 as well as an amount of dedicated functional circuitry for performing the data processing operation of the circuit. The task manager reads a task instruction from its associated task list, and interprets an opcode and various fields of the task instruction, and then controls the associated hardware of the dedicated functional circuitry to perform an operation as indicated by the task instruction. By placing appropriate task instructions into the task list for a particular circuit, processing circuit 206 can cause the dedicated functional circuitry of a particular circuit to perform a particular operation specified by the processing circuit. Processing circuit 206 can write task instructions into these task lists, modify these task lists, delete task lists, and otherwise maintain the task lists as desired via first bus 240. Each task list is maintained in memory 241 in a circular buffer. In the illustrated example, task list TL1 contains task instructions for the transmit channel 207. Task list TL2 contains task instructions for DEMOD 217. Task list TL3 contains task instructions for a demap/de-interleave/decode (DDE) circuit 239. As illustrated in FIG. 4, DDE circuit 239 includes the DEMAP circuit 218 and the DECODE circuit 219.

Additionally, FIG. 4 shows certain circuits of the transmit channel 207 of FIG. 3 in greater detail. These circuits include an encode/interleave/map circuit 270, MOD circuit 214, IFFT circuit 215, and a window and add circuit 271. The various circuits of transmit channel 207 are buffered by a set of buffer memories 272-275 as illustrated. The general path of transmit channel data is from left to right through circuits 272, 270, 273, 214, 274, 215, 275, 271, 210 to RF XVR circuit 204. The detail of encode/interleave/map circuit 270 includes the ENCODE circuit 212 of FIG. 3 and the MAP circuit 213 of FIG. 3.

As illustrated in FIG. 4, ENCODE circuit 212 includes a first encoder 246 with a code rate of 1/5 and a second encoder 247 with a code rate of 1/2. Processing circuit 206 can cause one of the two encoders to be selected and used and the other to be disabled and not used. Processor circuit 206 can do this by placing an appropriate configuration task instruction into the task list TL1. Task list TL1 is the task list for transmit channel 207. The task manager 248 of the transmit channel 207 reads the task instruction across bus 211, interprets the task instruction, identifies the field in the task instruction, and based on the value in the field enables and disables the two encoders 246 and 247 accordingly.

ENCODE circuit 212 may, in different transmitters 201, include encoders with code rates such as 1/5, 1/3, 1/2, 2/3, 3/4 and 5/6. Alternatively, ENCODE circuit 212 may include just one base encoder (such as the 1/5 rate encoder) which has the capability to generate encoded bits at several higher code rates via puncturing. Puncturing is a well-known technique whereby some encoded bits are punctured or deleted to give the effect of a higher code rate.

FIG. 4 also shows certain circuits of receive channel 208 of FIG. 3 in greater detail.

A "sample buffer" memory 249 buffers data passing from a front end 250 to FFT circuit 216. A "symbol buffer" memory 251 buffers data passing from FFT circuit 216 to DEMOD circuit 217. A "tile buffer" memory 252 buffers data passing from DEMOD circuit 217 to Demap/De-Interleave/Decode circuit (DDE) circuit 239. A "decode output buffer" memory 253 buffers data passing from DDE circuit 239 to bus 211. The general path of receive channel data is from right to left in FIG. 4 through circuits 209, 250, 249, 216, 251, 217, 252, 239, 253 to bus 211.

As illustrated in FIG. 4, DEMOD circuit 217 includes two demodulators, an MMSE demodulator 254 and a Maximum Likelihood (ML) demodulator 255. Processing circuit 206 can cause one of the two demodulators 254 or 255 to be selected and used and the other to be disabled and not used by placing an appropriate configuration task instruction into the task list TL2. Task list TL2 is the task list for DEMOD circuit 217. The task manager 256 of DEMOD circuit 217 reads the task instruction, interprets the task instruction, identifies the value of a field in the task instruction, and based on the value of the field enables and disables the two demodulators 254 and 255 accordingly.

Processing circuit 206 can also adjust the LLR bit width of the LLR values output by LLR generator 220 by placing an appropriate task instruction into the task list TL3. Task list TL3 is the task list for DDE circuit 239. The task manager 257 of DDE circuit 239 reads the task instruction, interprets the task instruction, identifies the field of the task instruction, and based on a value in the field adjusts the LLR bit width of LLR values output by LLR generator 220, as will be described in greater detail below.

Figures 5, 6:
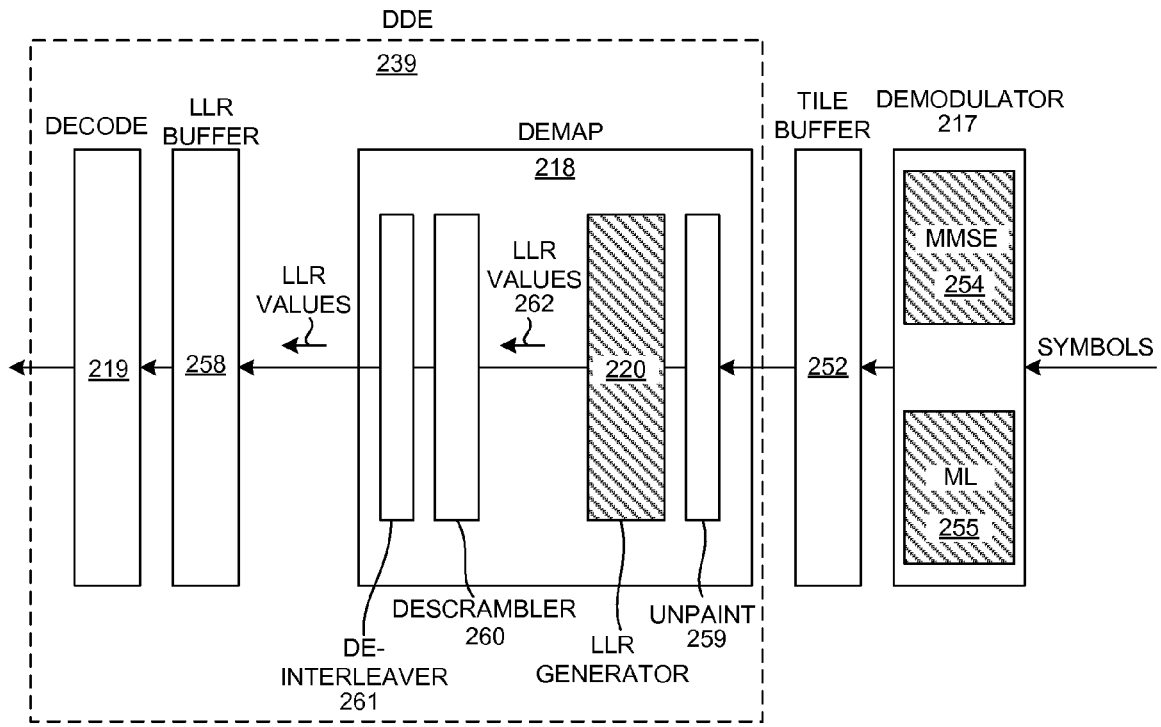
FIG. 5 is a more detailed diagram of the DDE circuit 239 of FIG. 4.
FIG. 6 illustrates a relationship between various parameters and the resulting LLR buffer memory required.

FIG. 5 is a more detailed diagram of DDE circuit 239. DDE circuit 239 includes DEMAP circuit 218, an LLR buffer memory 258 and DECODE circuit 219. DEMAP circuit 218 in turn includes an unpaint circuit 259, LLR generator 220, a descrambler circuit 260, and a de-interleaver circuit 261. Processing circuit 206 can control LLR generator 220 to output LLR values 262 of a selected "LLR bit width" by placing an appropriate task instruction into task list TL3 as described above.

Figure 2:
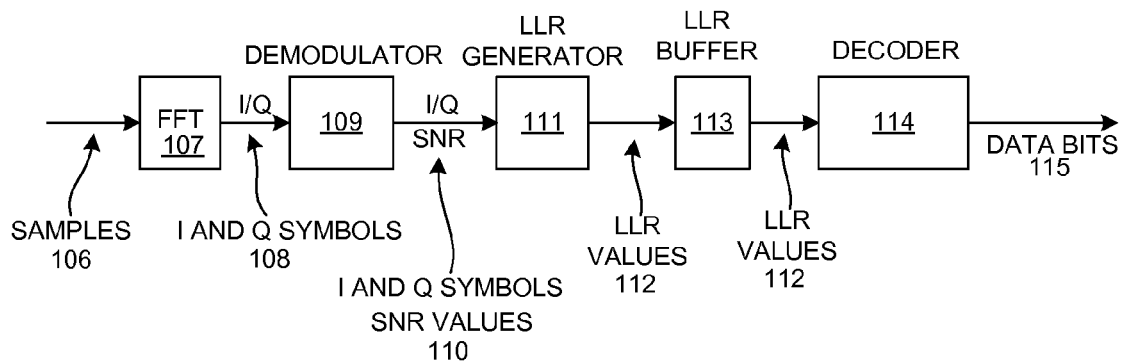
FIG. 2 (Prior Art) is a simplified block diagram illustrating receive channel processing in the receiver of a wireless communication device.

As is explained above in connection with FIG. 2, an LLR buffer is a memory that stores LLR values produced by an LLR generator. In the case of FIG. 5, LLR generator 220 outputs LLR values 262 which are stored into LLR buffer 258. The LLR buffer in a conventional high-speed modem may be fairly large and therefore relatively expensive to provide. There are various factors that contribute to increasing the amount of LLR buffer memory required: large data packet sizes, low code rates, the use of multiple interlaces with Hybrid ARQ (HARQ), and large LLR bit widths. If the amount of LLR buffer memory required in a receiver could be reduced, then substantial reductions in digital baseband integrated circuit die-size may result. Reductions in die-size may allow integrated circuit cost to be reduced.

DEMAP circuit 236 of the receiver of second wireless communication device 202 is of identical construction to the DEMAP circuit 218 of the first wireless communication device 201 illustrated in FIG. 5.

FIG. 6 is a diagram that illustrates how various factors or parameters combine to determine the amount of LLR buffer memory required. In one simplified equation, LLR buffer memory storage capacity is proportional to the product of four factors: 1) the inverse of encoder code rate, 2) LLR bit width, 3) packet size, and 4) the number of HARQ interlaces. The LLR buffer memory being considered here is, for example, the LLR buffer memory 263 in the receive channel of second wireless communication device 202 of FIG. 3.

The first parameter is encoder code rate. This "code rate" is the code rate of the encoder 212 used by the transmitting device 201. In this example, for an encoder encoding five encoded bits for each data bit, the code rate is 1/5. Thus, in the example equation, the inverse of the code rate is equal to a value of five. Encoders using other code rates of, for example, 1/3, 1/2 or 2/3 are possible.

The second parameter is LLR bit width. This "LLR bit width" is the number of bits used to represent the LLR values produced by the LLR generator 238 in the receiving second wireless communication device 202. In the illustrated example, an LLR generator using six bits to represent each LLR value gives a value of six in the equation. Using other bit widths of, for example, four, eight, or ten is possible.

Figure 1:
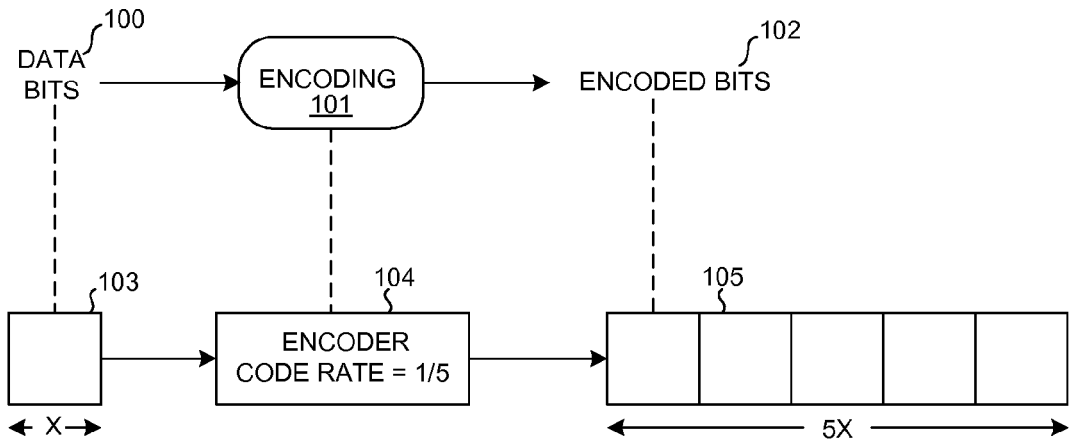
FIG. 1 (Prior Art) is a simplified block diagram illustrating an encoding process performed in the transmitter of a wireless communication device.

The third parameter is packet size. Packet size is the number of data bits in a packet which are encoded, transmitted, received, and decoded. For example, FIG. 1 shows the packet size as "X" number of bits to be encoded. In the illustration of FIG. 6, the packet size is 40K (forty times 1024) bits.

The fourth parameter is the number of HARQ interlaces. Interlaces are frames that carry independently encoded packets. Each frame is a set of contiguous OFDM symbols. A packet transmission can have, for example, N=6 interlaces comprised of N=6 consecutive frames, and with each frame having M=8 OFDM symbols. In a superframe of twenty-four frames, the interlace pattern could read as, for example, 0,1, 2,3,4,5,0,1,2,3,4,5,0,1,2,3,4,5,0,1,2,3,4,5. for frames 0,1,2, 3, . . . , 23. For interlaces using HARQ encoding the encoded bits of a given packet are sent across several frames belonging to the same interlace. For example, the encoded bits of a first packet can be transmitted in frames 0, 6, 12, 18 and 24. The encoded bits of a second packet can transmitted in frames 1, 7, 13, 19, 25 and so on. The receiver processes LLRs from frames 0, 6, 12, 18 and 24 to decode the first packet, and LLRs from frames 1, 7, 13, 19 and 25 to decode the second packet. The LLR buffer allocates independent storage for LLR values from each interlace so that LLR values belonging to different frames do not overwrite each other in the LLR buffer. Thus, each additional interlace increases the number of bits that LLR buffer 263 is able to hold. In the illustrated example, there are six interlaces.

Using the example values in the equation of FIG. 6, the LLR buffer memory capacity requirement for LLR buffer 263 is determined to be 7.2 Megabits (Mbits).

Figure 7:
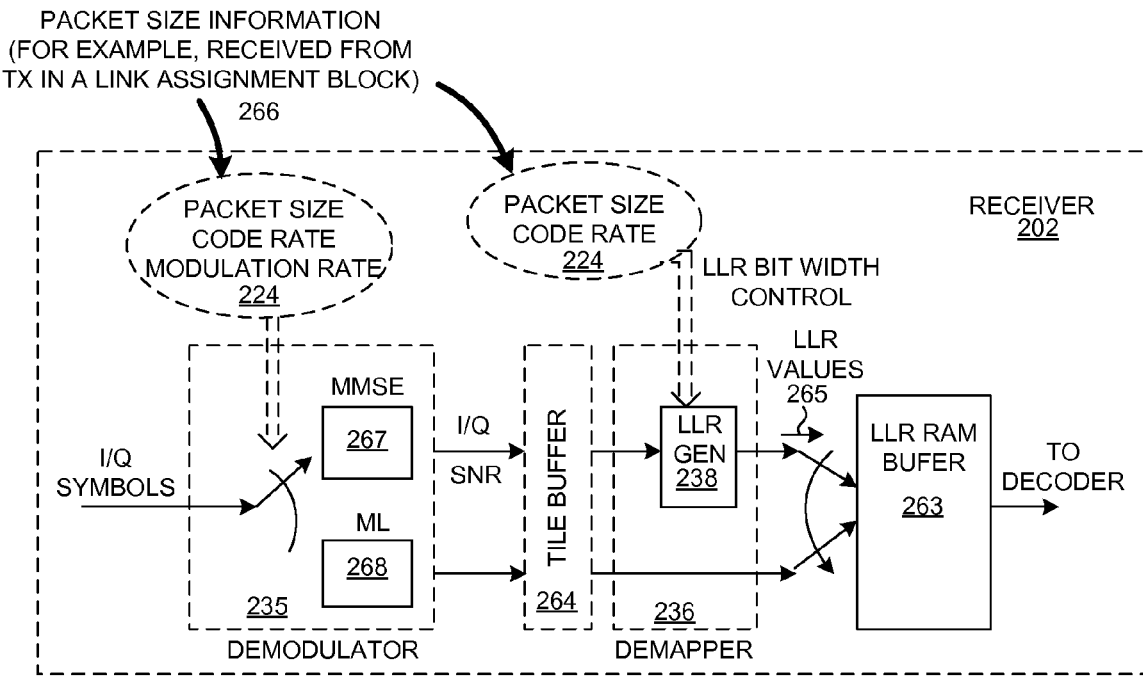
FIG. 7 is a simplified block diagram of a first aspect in which a receiving wireless communication device adjusts the LLR bit width to reduce the amount of LLR buffer memory required without unduly reducing receiver performance.

First Aspect:

FIG. 7 is a simplified block diagram in accordance with a first aspect. LLR buffer 263 in FIG. 7 is the LLR buffer in the receive channel of the second wireless communication device 202 of FIG. 3. LLR generator 238 is the LLR generator of the DEMAP circuit 236 of the second wireless communication device 202 of FIG. 3. Tile buffer 264 is a tile buffer disposed between DEMOD circuit 235 and DEMAP circuit 236 in the second wireless communication device. The DEMOD circuit 235 of FIG. 7 is the DEMOD circuit 235 in the receive channel of the second wireless communication device 202 of FIG. 3. In accordance with the first aspect, processing circuit 224 of the receiver 202 adjusts the LLR bit width used to represent LLR values 265 flowing into the LLR buffer memory 263, thereby allowing the use of an LLR buffer 263 with less storage capacity. In this example, LLR buffer 263 has a capacity of 2.0 Megabits.

In one operational example, receiver 202 initially receives a transmission with a packet size of 8K bits encoded at a code rate of 1/5, with six interlaces or frames. Packet size and code rate information may be received, for example, from the first wireless communication device 201 in a communication called a link assignment block or forward link control block 266. By the equation of FIG. 6, an LLR bit width of six bits can be used without exceeding the 2.0 Megabit capacity of LLR buffer 263. The processing circuit 224 receives these parameters and controls LLR generator 238 to produce LLR values 265 with a bit width of six. In the same operational example, a bit width of six can be used with a packet size of 12K encoded at a code rate of 1/3 without exceeding the 2.0 Megabit capacity of LLR buffer 263. Also in the same example, a bit width of six can be used with a packet size of 20K encoded at a code rate of 1/2 without exceeding the 2.0 Megabit capacity of LLR buffer 263.

If receiver 202 receives from transmitter 201 a forward link control block 266 indicating that the transmitted packet is larger, then processing circuit 224 may determine that a smaller LLR bit width should be used so as not to exceed the 2.0 Megabit capacity of LLR buffer 263. In one example, receiver 202 receives a forward link control block indicating that a transmitted packet has a packet size of 40K and a code rate of 1/2. The processing circuit 224 determines that, under the equation of FIG. 6, an LLR bit width of four bits should be used. Processing circuit 224 controls LLR generator 238 to produce LLR values 265 with a bit width of four, thereby allowing LLR buffer 263 to buffer the transmission of six interlaces with a packet size of 40K and encoded at a rate of 1/2.

One possible consequence of using a smaller LLR bit width is a decrease in receiver 202 performance. FIG. 7 illustrates switching between multiple demodulators in the DEMOD circuit 235 in order to compensate for the use of smaller LLR bit widths. In the illustrated embodiment, an MMSE demodulator (MMSE) 267 and an ML demodulator (ML) 268 are disposed upstream of LLR generator 238 in the receive channel 226. ML demodulator 268 has a higher performance than MMSE demodulator 267, with a trade-off of higher power consumption and greater latency when ML modulation 268 is used for demodulation. For example, the default operation of the receiver may be to use an MMSE demodulator 267 to save power and achieve reasonable performance when LLR generator 238 is set to use an LLR bit width of six bits. However, when LLR generator 238 is set to use smaller LLR bit widths, the processing circuit 224 may determine that it is advantageous to use the higher performance ML demodulator 268 for demodulation. For incoming transmissions of increasing packet sizes and higher code rate, but lower modulation rates (e.g. QPSK), the processing circuit 224 controls DEMOD circuit 235 to use ML demodulator 268, thus compensating for the decreased performance resulting from smaller LLR bit widths, but also resulting in higher power consumption and latency. Because an ML-type demodulator typically includes LLR generation as part of its function, the separate LLR generator 238 is not shown in the receive channel data path in FIG. 7 between ML demodulator 268 and LLR buffer 263.

In the example of FIG. 7, processing circuit 224 uses a task instruction to cause the LLR generator 238 within DEMAP circuit 236 to output LLR values of the appropriate LLR bit width. Similarly, processing circuit 224 uses a task instruction to cause DEMOD circuit 235 to select the appropriate one of demodulators 267 or 268. In other examples, the LLR generator 238 may be controlled and demodulator selection made using switches, configuration parameters, configuration registers, or other methods.

Figure 8:
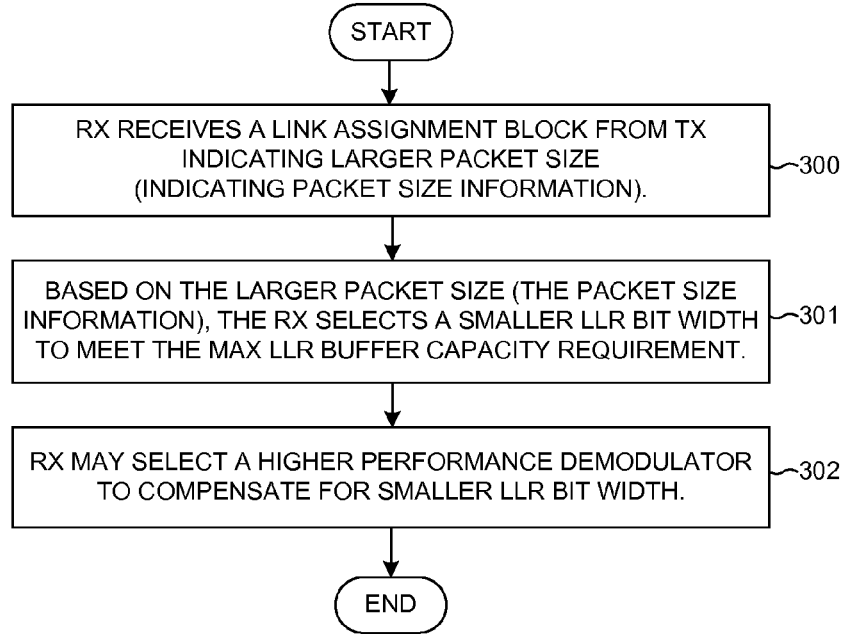
FIG. 8 is a simplified flowchart of a method in accordance with the first aspect.

FIG. 8 is a simplified flowchart of a method in accordance with the first aspect described in connection with FIG. 7. In a first step (step 300), a receiver (for example, second wireless communication device 202) receives a forward link control block 266 from a transmitter (for example, from first wireless communication device 201). The forward link control block 266 contains information indicating the packet size being used by the transmitting device. Based on the packet size information and the equation of FIG. 6, the processing circuit 224 in the receiver determines that the incoming transmission is too large to be buffered by LLR buffer 263 at the LLR bit width in use. The processing circuit 224 of the receiver therefore selects (step 301) a smaller LLR bit width so that the storage capacity of LLR buffer 263 is not exceeded. In some cases, the processing circuit 224 of receiver 202 selects (step 302) a higher performance demodulator to compensate for performance loss occasioned by the use of a smaller LLR bit width.

FIG. 9 is a diagram that shows how the LLR bit width selection determination and the demodulator selection determination are made as functions of the code rate and packet size input parameters. A decision-making functionality that operates in accordance with the relationships set forth in the table of FIG. 9 is embodied in a program executed by processing circuit 224. The program may be stored in a memory (not shown) coupled to processor 224 via bus 229 in the receiving wireless communication device 202. This memory is of identical construction to the memory 224 in the transmitting device 201 between integrated circuits 203 and 221 are identical.

FIG. 10 is an example algorithm or relationship usable to determine the demodulator selection and LLR bit width selection outputs based on the code rate, modulation rate and packet size input parameters in accordance with the first aspect. The LLR bit width used by the LLR generator 238 increases with LLR buffer 263 size and the code rate used in the transmitter 201. The LLR bit width used by the LLR generator 238 decreases with the packet size and number of interlaces used in the transmitter 201.

Figure 11:
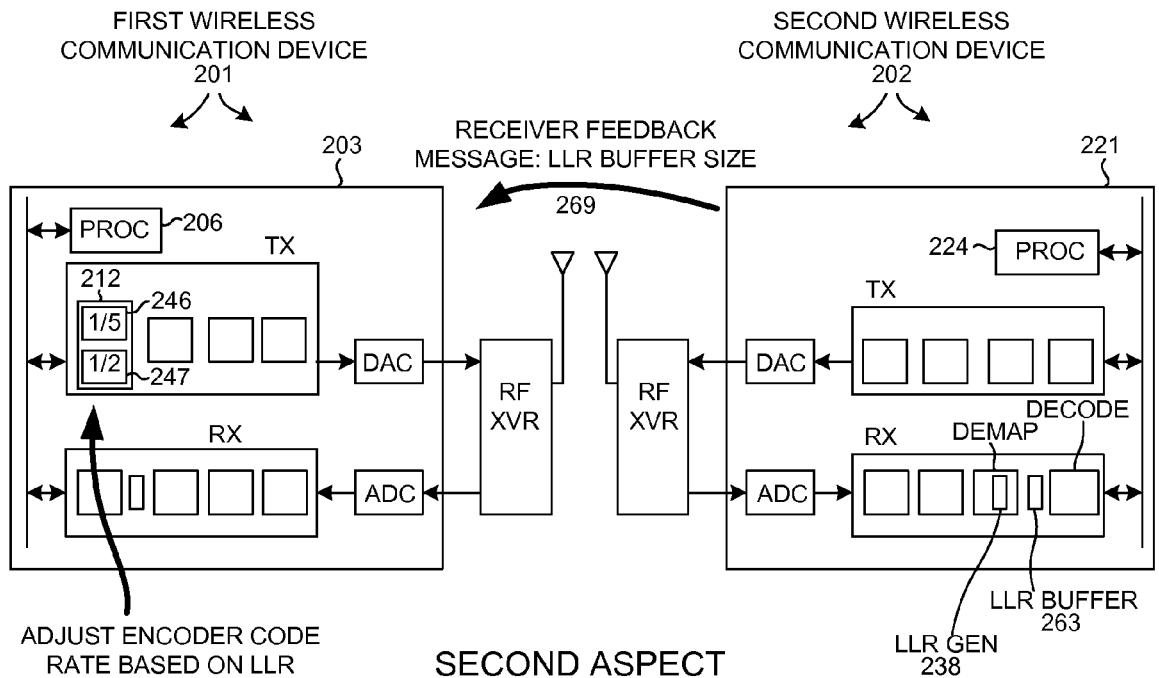
FIG. 11 is a simplified block diagram of a second aspect in which a transmitting wireless communication device selects between multiple encoders to adjust encoder code rate based on transmission packet size and the known capacity of an LLR buffer in the receiving wireless communication device.

Second Aspect:

FIG. 11 is a simplified block diagram in accordance with a second aspect. In the second aspect, the transmitting first wireless communication device 201 is made to adjust the code rate of its encoder 212, based on transmission packet size and the known capacity of LLR buffer 263 of the receiving wireless communication device 202, so as not to exceed the storage capacity of receiver LLR buffer 263.

In one operational example, transmitter 201 is initially transmitting transmissions with six interlaces and a packet size of 12K bits. Receiver 202 communicates to transmitter 201 via a receiver feedback message 269. The receiver feedback message 269 indicates the storage capacity and LLR bit width of receiver LLR buffer 263. In this example, LLR buffer 263 has a capacity of 3.0 Megabits. It is assumed that receiver 202 is using an LLR bit width of six bits. Therefore, processing circuit 206 of transmitting device 201 is able to determine, using the equation of FIG. 6, that transmissions with these parameters can be buffered by the receiver's 3.0 Megabit LLR buffer 263 when encoded using an encoder with a low code rate, such as 1/5. The processing circuit 206 of transmitter 201 therefore does not change code rate and continues to control encoder 246 to provide a code rate of 1/5.

In the same example, transmitter 201 is then to transmit packets of a larger packet size. Because receiver 202 has communicated to transmitter 201 a receiver feedback message 269 indicating the 3.0 Megabit storage capacity of LLR buffer 263, the processing circuit 206 of transmitter 201 is able to determine a code rate to use that will not cause the receiver's LLR buffer 263 storage capacity to be exceeded. To transmit packet sizes of 28K to example receiver 202 with an LLR buffer 263 of 3 Megabits, transmitter 201 selects the encoder 247 that has a code rate of 1/2. By the equation of FIG. 6, processing circuit 206 of transmitter 201 determines that LLR buffer 263 of the receiver will be able to buffer transmissions at those parameters. In this way, processor 206 adjusts the code rate to maximize performance without exceeding the LLR buffer storage capacity of LLR buffer 263. In the present example, processing circuit 206 controls ENCODE circuit 212 to use the appropriate code rate by placing a task instruction on the task list TL1 for transmit channel 207. Although adjustment of code rate is illustrated here by the selection of one of multiple encoders, the adjustment of code rate can be accomplished in other ways in other embodiments. For example, in one example the transmitter 201 adjusts code rate by using a puncture or depuncture module to alter encoder code rate.

Figure 12:
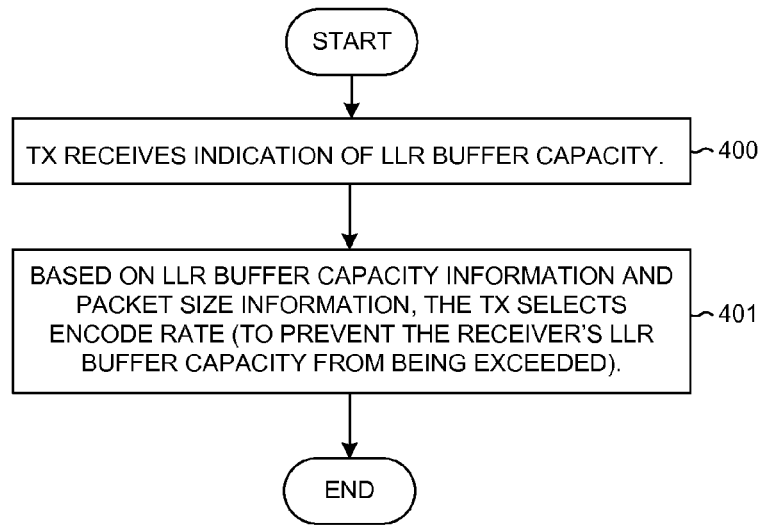
FIG. 12 is a simplified flowchart of a method in accordance with the second aspect.

FIG. 12 is a simplified flowchart of a method in accordance with the second aspect. In a first step (step 400), a transmitter (for example, first wireless communication device 201) receives an indication of the LLR buffer capacity of a receiver (for example, from second wireless communication device 202). Then, using the equation of FIG. 6 and the packet size, the transmitter controls encoder code rate (step 401) to maximize performance while preventing the LLR buffer capacity from being exceeded. If it is determined that LLR buffer capacity will be exceeded, then the transmitter adjusts encoder code rate, whereas if LLR buffer capacity is determined not to be exceeded, then the transmitter does not adjust encoder code rate.

FIG. 13 is a diagram showing how the code rate can be determined from the input parameters of packet size and LLR buffer capacity. Processing circuit 206 in the transmitter 201 may use such a table determined by the processing circuit 224 of the receiver 202 to make the determination of what code rate should be used. Or, the processing circuit 206 of the transmitter 201 may determine such a table of code rates based on known factors.

FIG. 14 is an example algorithm or relationship usable to determine the code rate in the transmitter based on the packet size, the number of interlaces, the LLR bit width and the LLR buffer 258 size in accordance with the second aspect. The code rate chosen by the transmitter 201 increases with packet size, number of interlaces, and the LLR bit width used in the receiver 202. The code rate chosen by the transmitter 201 decreases with the LLR buffer 258 capacity of the receiver 202. In the example algorithm, the transmitter has a maximum code rate of 1/2. If the algorithm gives a code rate value that is higher than the maximum code rate that can be supported by the transmitter 201, the transmitter 201 may use decreased packet sizes or fewer interlaces.

Various combinations of the first and second aspects described above may be employed. For example, the receiver 202 may employ the first aspect of adjusting LLR bit width and, at the same time, use the transmitter 201 to employ the second aspect of adjusting encoder code rate. In another example, the receiver 202 may select a modulator with increased performance to compensate for the use of a higher code rate by the transmitter 201.

The techniques described herein may be implemented by various means. In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A system comprising a receiver and a transmitter, comprising:
   an encoding circuit, wherein the encoding circuit has a code rate; and
   a processing circuit configured to use Log-Likelihood Ratio information to control the encoding circuit such that the code rate is changed, wherein the Log-Likelihood Ratio information corresponds to the receiver and comprises Log-Likelihood Ratio buffer capacity information and other information identifying a plurality of Log-Likelihood Ratio bit widths selectable by the receiver based on the Log-Likelihood Ratio buffer capacity information, wherein the processing circuit changes the code rate when it is determined that encoded data transmitted by the transmitter causes a Log-likelihood Ratio buffer storage capacity to be exceeded, and wherein the code rate is not changed when it is determined that the Log-Likelihood Ratio buffer storage capacity will not be exceeded.

2. The transmitter of claim 1, wherein the encoding circuit includes a first encoder and a second encoder, wherein the first encoder has a first code rate, wherein the second encoder has a second code rate, and wherein the processing circuit changes the code rate by changing which one of the first and second encoders is used to perform encoding within the encoding circuit.

3. The transmitter of claim 1, wherein the processing circuit is configured to change the code rate of the encoding circuit by selecting an encoder and a code rate for the selected encoder.

4. The transmitter of claim 1, wherein the processing circuit is configured to select a puncturing rate, wherein the code rate is changed by changing the puncturing rate.

5. The transmitter of claim 1, wherein the processing circuit is further configured to use packet size information to control the encoding circuit such that the code rate is changed.

6. The transmitter of claim 1, wherein the processing circuit is further configured to change a quantity of hybrid automatic interlaces based on the Log-Likelihood Ratio buffer capacity information.

7. A system comprising a receiver and a transmitter comprising:
   an encoding circuit, wherein the encoding circuit uses a number of interlaces; and
   a processing circuit configured to use Log-likelihood Ratio information to control the encoding circuit such that the number of interlaces is changed, wherein the Log-Likelihood Ratio information corresponds to the receiver and comprises Log-Likelihood Ratio buffer capacity information and other information identifying a plurality of Log-Likelihood Ratio bit widths selectable by the receiver based on the Log-Likelihood Ratio buffer capacity information, wherein the processing circuit changes a code rate of the encoding circuit when it is determined that encoded data transmitted by the transmitter causes a Log-likelihood Ratio buffer storage capacity to be exceeded, and wherein the code rate is not changed when it is determined that the Log-Likelihood Ratio buffer storage capacity will not be exceeded.

8. A method comprising:
   adjusting a code rate of an encoder of a transmitter based at least in part on Log-Likelihood Ratio information, wherein the Log-Likelihood Ratio information comprises Log-Likelihood Ratio buffer capacity information indicative of a storage capacity of a Log-Likelihood Ratio buffer within a receiver, and other information identifying a plurality of Log-Likelihood Ratio bit widths selectable by the receiver based on the Log-Likelihood Ratio buffer capacity information, wherein the code rate is changed when it is determined that encoded data transmitted by the transmitter causes the Log-Likelihood Ratio buffer storage capacity to be exceeded, and wherein the code rate is not changed when it is determined that the Log-Likelihood Ratio buffer storage capacity will not be exceeded.

9. The method of claim 8, further comprising:
   receiving a communication that includes the Log-Likelihood Ratio information from the receiver.

10. A computer program product, comprising:
    a non-transitory computer-readable medium comprising:
    code for causing a computer to use Log-Likelihood Ratio information to control an encoding circuit of a transmitter such that a code rate of the encoding circuit is changed, wherein the Log-Likelihood Ratio information corresponds to a receiver and comprises Log-Likelihood Ratio buffer capacity information and identifies a plurality of Log-Likelihood Ratio bit widths selectable by the receiver based on the Log-Likelihood Ratio buffer capacity information, wherein the computer changes the code rate when it is determined that encoded data transmitted by the transmitter causes a Log-likelihood Ratio buffer storage capacity to be exceeded, and wherein the code rate is not changed when it is determined that the Log-Likelihood Ratio buffer storage capacity will not be exceeded.

11. The computer program product of claim 10, wherein the Log-Likelihood Ratio buffer capacity information is indicative of a storage capacity of a Log-Likelihood Ratio buffer of the receiver.

12. An apparatus for adjusting a code rate, comprising:
    encoding means for encoding data in a transmitter of a wireless communication device, the encoding means comprising at least one encoder; and means for adjusting a code rate used for encoding the data, wherein the code rate is adjusted based at least in part on Log-Likelihood Ratio buffer capacity information indicative of a storage capacity of a Log-Likelihood Ratio buffer within a receiver and on other information identifying a plurality of Log-Likelihood Ratio bit widths selectable by the receiver based on the Log-Likelihood Ratio buffer capacity information, wherein the means for adjusting adjusts the code rate when it is determined that encoded data transmitted by the transmitter causes the Log-Likelihood Ratio buffer storage capacity to be exceeded, and wherein the code rate is not changed when it is determined that the Log-Likelihood Ratio buffer storage capacity will not be exceeded.

13. The apparatus of claim 12, further comprising:
means for receiving a communication from the receiver that includes the Log-Likelihood Ratio buffer capacity information.

* * * * *